United States Patent

Bundza

[19]

[11] Patent Number: 6,137,051
[45] Date of Patent: Oct. 24, 2000

[54] EMI SHIELD/ GASKET ENCLOSURE

[75] Inventor: Nicholas Adam Bundza, Ottawa, Canada

[73] Assignee: Nortel Networks Corporation, Montreal, Canada

[21] Appl. No.: 09/207,251

[22] Filed: Dec. 9, 1998

[51] Int. Cl.[7] .................................................. H05K 9/00
[52] U.S. Cl. ...................... 174/35 R; 361/752; 361/753; 361/816
[58] Field of Search ............................. 174/35 R, 35 GC; 361/816, 818, 800, 799, 753, 752

[56] References Cited

U.S. PATENT DOCUMENTS 5,014,160   5/1991   McCoy, Jr. .............................. 361/818
5,774,344   6/1998   Casebolt ................................. 361/800

*Primary Examiner*—Kristine Kincaid
*Assistant Examiner*—Hung V Ngo

[57] ABSTRACT

An electromagnetic interference and compatibility (EMI/EMC) shielding enclosure for a printed circuit board (PCB) or other electronic components has a conductive plastic top housing portion and a conductive bottom housing portion. The top housing portion has projecting fingers integral therewith. The bottom housing portion has an inner surface with walls projecting therefrom for substantially encompassing the PCB. When the enclosure is assembled, the PCB is located between the top housing portion and the bottom housing portion, the fingers from the top housing portion surround at least a major portion of the PCB and the fingers physically contact the bottom housing portion or are sufficiently close for capacitive coupling.

28 Claims, 9 Drawing Sheets

EMI SHIELD/ GASKET ENCLOSURE

FIELD OF THE INVENTION

The invention relates to electromagnetic interference (EMI) shields and electromagnetic compatibility (EMC) shields.

BACKGROUND OF THE INVENTION

In electronics systems, many devices and techniques have been developed to provide EMI/EMC shielding (EMI shielding prevents electromagnetic radiation from escaping. EMC shielding prevents electromagnetic radiation from entering.) Electronic components, such as printed circuit board (PCBs) for example, generate electromagnetic wave energy. Typically, each printed circuit board is separately housed within an enclosure. EMI/EMC shielding is desirable for two main reasons. It is desirable that electromagnetic wave energy generated by electronic components be contained to avoid adversely affecting or interfering with the operation of other electronic components. As well, it is desirable that electromagnetic wave energy generated from other electronic components be shielded from the electronic components to avoid interfering with the operation of the electronic components.

Typically, enclosures for electronics, such as PCBs, for example, have a top surface and a bottom surface and a separate gasket between the top surface and the bottom surface to provide EMI/EMC shielding. In some cases, each side of the electronics requires a gasket. Well-known types of gaskets include rope-like gaskets and spring finger gaskets.

Gaskets are often elastomeric and rope-like or string-like and contain or are coated with conductive particulate (gaskets must be electrically conductive in order to contain electromagnetic wave energy). In an enclosure having a top surface and a bottom surface, either the top surface or the bottom surface of the enclosure may have a guiding feature for routing the EMI/EMC gasket around the perimeter of the surface (or at least around the area where the PCB or electronic components will be located). The guiding feature also holds the gasket in place.

For the purpose of this example (ie: for ease of reference), the guiding feature is located within the top surface. The guiding feature is typically a "groove" formed within the top surface, with a width slightly less than the diameter of the rope gasket. To use the gasket, the one end of the gasket is usually manually pushed into one portion of the guide, and then the remaining length of the gasket is pushed into the guide around the perimeter of the surface.

When the top surface of the enclosure is then mated with the bottom surface, the EMI/EMC gasket will contact the bottom surface, thereby providing EMI/EMC shielding around the electronic components.

Because EMI/EMC gaskets often require that a guide be incorporated within either the top or bottom surface of the enclosure, and because such gaskets are often manually fitted around the perimeter of one surface, the use and installation of these types of gaskets tends to be relatively time-consuming and expensive. As well, the cost of manufacturing the top or bottom surface having a guide in addition to the cost of separately manufacturing such gaskets adds to the cost of the electronics system. In fact, the cost of manufacturing gaskets themselves is relatively high and is often the greatest single cost of the electronics packaging.

Instead of using rope-like gaskets, some electronics enclosures use spring finger gaskets (usually metallic). spring finger gaskets typically have a flat strip portion. The strip portion has a number of uniformly-spaced, biased fingers projecting from one surface. To use spring finger gaskets, a number of spring finger gaskets are adhered, typically either glued or clipped, to the top (or bottom) surface of the enclosure, around the area which will be occupied by the electronics. When the top surface is mated with the bottom surface, the spring fingers of the gasket will contact the bottom surface, thereby providing EMI/EMC shielding around the electronics.

Because spring finger gaskets must be manufactured separately from the top and bottom surfaces of the enclosure and because such gaskets must be manually or at least separately adhered to one surface of the enclosure, the installation of such gaskets tends to be time-consuming and the manufacture and installation of such gaskets tends to be relatively expensive.

In some cases, EMI/EMC gaskets cannot be re-used after disassembly. In some cases, EMI/EMC gaskets produce or require high clamping pressure, which necessitates stiff covers and a large number of fasteners. In some cases, EMI/EMC gaskets create galvanic corrosion problems due to dissimilar materials with respect to the electronics or enclosure components which results in degrading performance over time.

Accordingly, it would be desirable to have a gasket which is not separate from the enclosure and which does not require installation. In this regard, EMI "shield cans" are known, which are sheet metal enclosures for a PCB carrying electronic components. Some of the components are grouped together and it is one or more groups which are shielded by an EMI shield can. Typically, EMI shield cans consist of two main parts. A first part has four upstanding walls around the electronics. A second part fits over the four walls. The second part has a flat roof, to cover the area defined by the four wall. The second part also has evenly spaced, flexible fingers. When the second part is placed over the first part, the fingers securely hold the second part to the first part.

While EMI shield cans, by their design, are housings, electronic components typically have housings in addition to, or in any case, distinct from, EMI shield cans. These non-EMI shield can housings may have features lacking in EMI shield cans such as heat sinks, for example. It would be desirable to eliminate the need to have both EMI shield cans and another housing for a single substrate or the same electronic components. Further, because EMI shield cans are made from sheet metal, they suffer from the inherent limitations of sheet metal. For example, because EMI shield cans are made from sheet metal, the entire surface of the EMI shield can has the same thickness. In other words, by using sheet metal, it is difficult to vary the thickness of different portions of the EMI shield can. Further, when using sheet metal, it is difficult to include bosses and certain other features in the shield can. Moreover, non-EMI shield can housings are also typically needed, in part, to provide an aesthetically pleasing appearance for the user. Accordingly, it would be desirable to create EMI/EMC shields, capable of having varying thickness at different portions of the shield, capable of having bosses formed therein while also being integral with a housing for electronic components. It would also be desirable to incorporate other features common in moulded plastic parts, such as cosmetic features, snap fits, catches and other user interface features, such as handles, for instance.

SUMMARY OF THE INVENTION

It is an object of the invention to obviate or mitigate one or more of the above identified disadvantages.

According to a first broad aspect, the invention provides an electromagnetic interference and compatibility (EMI/EMC) shielding enclosure for electronic components. The enclosure has a conductive plastic first housing portion and a conductive second housing portion. The first housing portion has projecting fingers integral therewith. The second housing portion has an inner surface with walls projecting therefrom for substantially encompassing the components or a portion of the electronic components. When the enclosure is assembled, the electronic components (or a portion thereof) are located between the first housing portion and the second housing portion, with the fingers from the first housing portion surrounding at least a major portion of the electronic components (or portion thereof). The fingers of the first housing portion contact the second housing portion or are sufficiently close for capacitive coupling.

According to another broad aspect, the invention provides an electronics assembly comprising electronic components and an electromagnetic interference and compatibility (EMI/EMC) shielding enclosure for the electronic components, the enclosure comprising a conductive plastic first housing portion having projecting, resilient fingers integral therewith and a conductive second housing portion, the electronic components being located between the first housing portion and the second housing portion, the fingers from the first housing portion surrounding at least a major portion of the electronic components and contacting the second housing portion.

According to yet another broad embodiment, the invention provides an EMI/EMC shielding enclosure for electronic components, the enclosure comprising a conductive plastic first housing portion having projecting, resilient fingers integral therewith and a conductive second housing portion, wherein, when the enclosure is assembled with the electronic components located between the first housing portion and the second housing portion, the fingers from the first housing portion surround at least a major portion of the electronic components and contact the second housing portion.

Advantages of the present invention include having an integrated gasket for EMI/EMC shielding, which eliminates the need to separately manufacture and separately install a gasket, thereby reducing the cost of production of the enclosure and the time for assembling the enclosure.

BRIEF DESCRIPTION OF THE DRAWINGS

Preferred embodiments of the invention will now be described with reference to the attached drawings in which

FIG. 4b is a perspective view of the outside surface of the top housing portion of FIG. 4a;

DETAILED DESCRIPTION OF THE PREFERRED EMBODIMENTS

Electronics systems or electronics assemblies typically contain one or more electronic circuits and an enclosure to provide EMI/EMC shielding. A representative electronics system is a transmit and receive unit (TRU) which may otherwise be known as a wireless base station radio (not shown). Each TRU comprises, among other things, a PCB and a PCB enclosure providing EMI/EMC shielding. Several TRUs are typically placed parallel to each other in a shelf. The shelf is located in a frame. The following description may apply to a TRU or any other electrical assembly which needs both an enclosure and EMI/EMC shielding. The electronics assembly may include electronic components which may or may not be carried on a substrate. The electronic components may be discreet electronic components held together by discrete wires (which may include power supply modules, microwave or RF circuits, or for example, solid state devices wired together) or may be electronic components carried on a substrate such as a PCB, flex circuits or 3-dimensional circuits (ie: conductive elements plated on plastic, for example).

Figure 1:
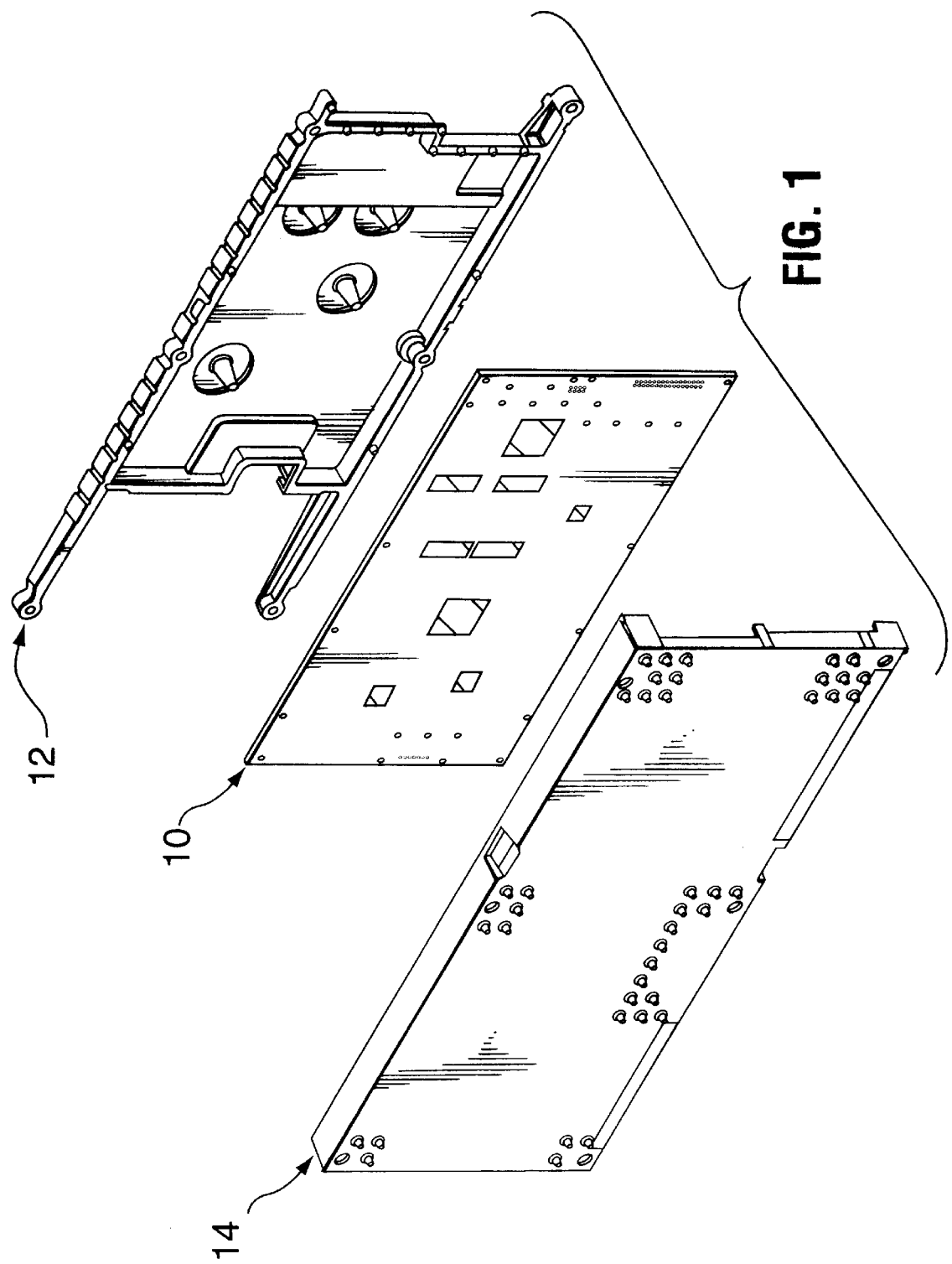
FIG. 1 is an exploded perspective view of a PCB between a bottom housing portion and a top housing portion in accordance with an embodiment of the present invention.
Figure 2:
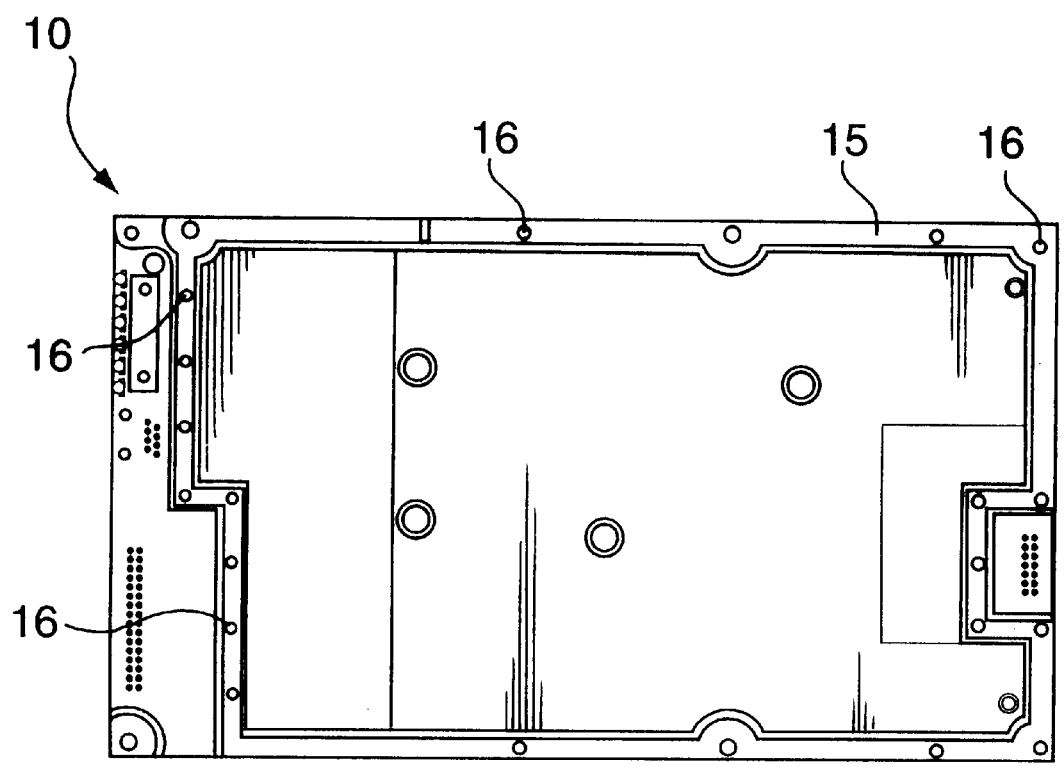
FIG. 2 is a top view of a representative PCB.

FIG. 1 is an exploded, perspective view of a PCB 10 between a top housing portion 12 and a bottom housing portion 14. The PCB 10 is shown in top view in FIG. 2. A peripheral electrically conductive strip 15 is printed on or near the perimeter of each side of the PCB 10. The PCB 10 preferably has alignment holes 16 extending substantially around or near the perimeter of the PCB 10.

Figure 3:
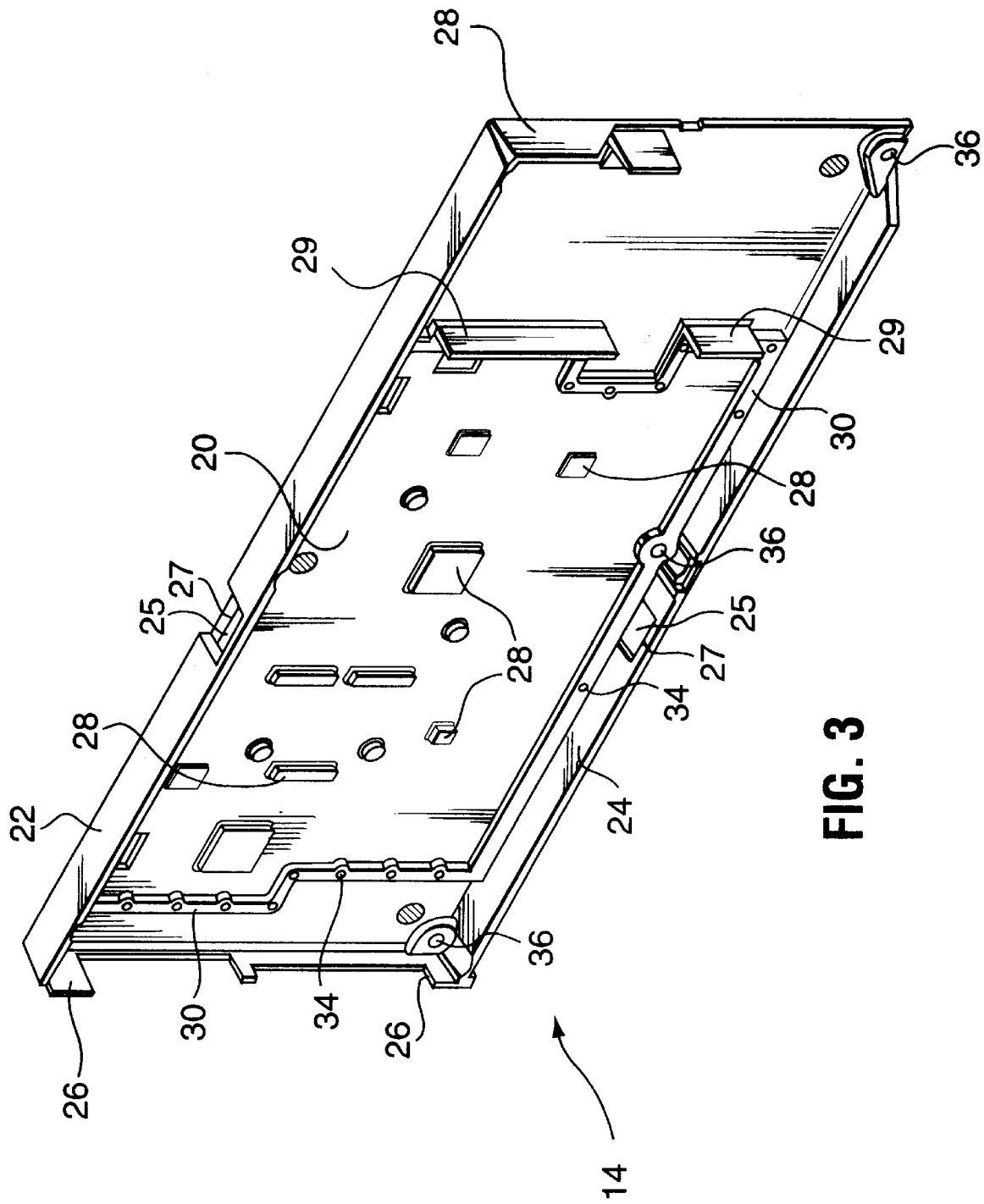
FIG. 3 is a perspective view of the bottom housing portion of FIG. 1.

The bottom housing portion 14 is shown in perspective view in FIG. 3. The bottom housing portion 14 can be made of any suitable electrically conductive material such as aluminum or steel and is dye cast. The bottom housing portion 14 could also be made of metallized plastic. The bottom housing portion 14 has an inner surface 20 and an outer surface (not shown). Because one of the functions of the bottom housing portion 14 may be to act as a heat sink, the outer surface may have many spaced pins or fins (not shown) projecting outwardly therefrom.

The inner surface 20 has side walls 22, 24, forward wall 26, rear wall 28 and PCB enclosure walls 29 projecting perpendicularly outward therefrom. Preferably, each of side walls 22, 24 has a wall window 25, which is an opening within each side wall 22, 24. The upper surface of each wall window 25 is defined by an upper surface 27.

Raised from the inner surface 20, between walls 22, 24, 26, 29, are PCB supports 28, 30. Preferably, PCB support 30 incorporates alignment indentations 34 and screw-receiving indentations 36.

Figure 4A:
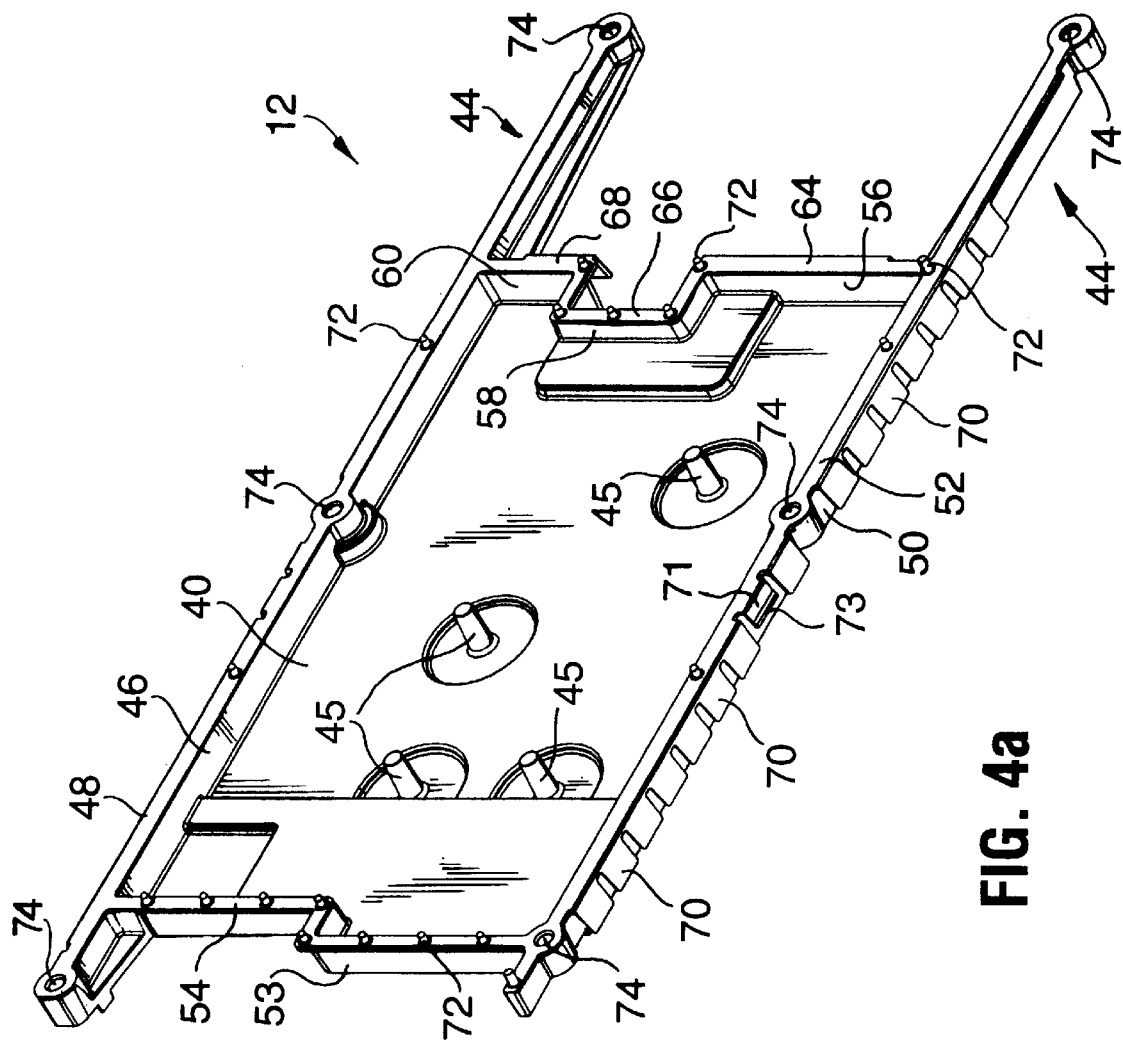
FIG. 4a is a perspective view of the inside surface of the top housing portion of FIG. 1.
Figure 4B:
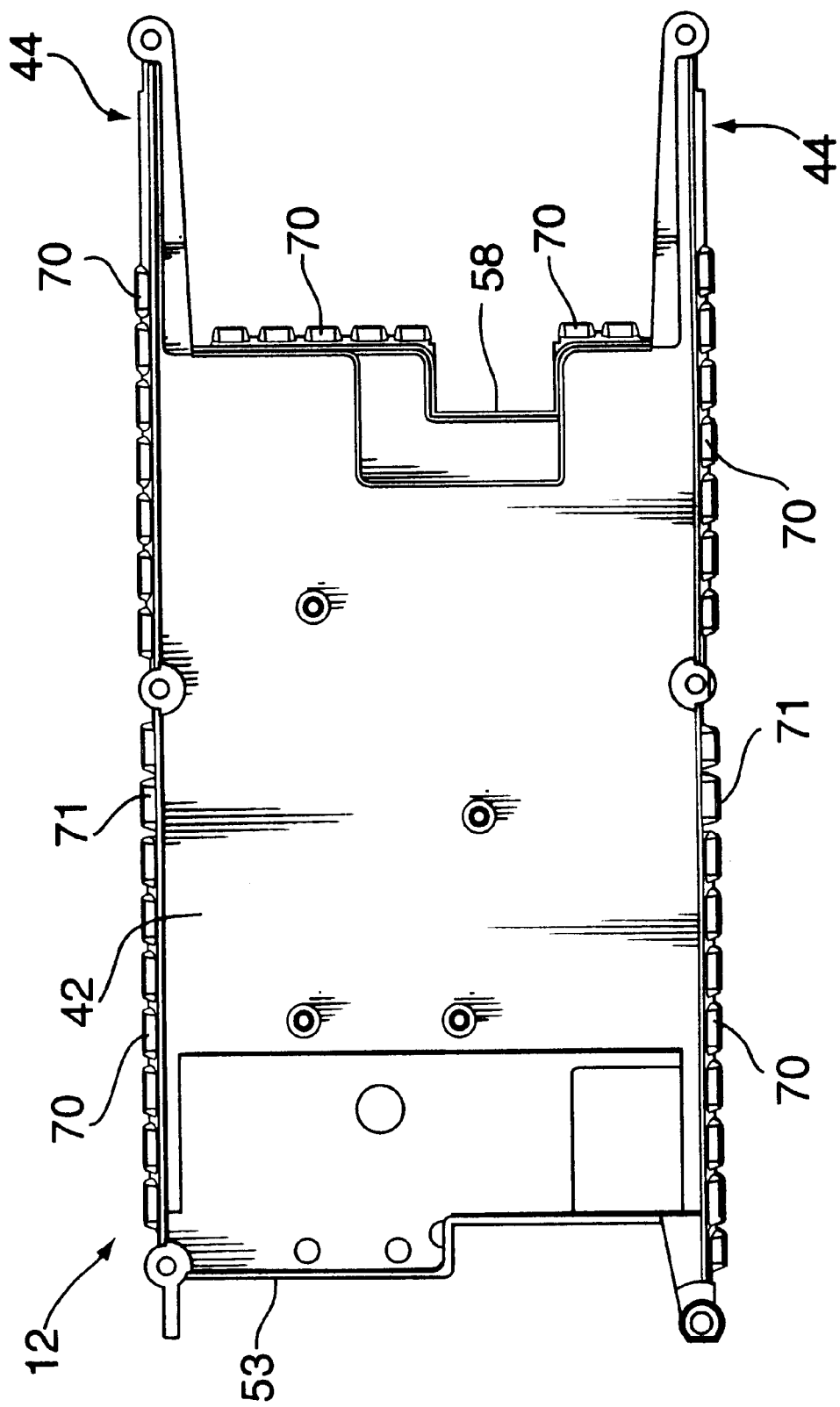

The top housing portion 12 is shown in perspective view and in top view in FIGS. 4a and 4b, respectively. The top housing portion 12 is made of metal-plated plastic or metal-filled plastic and is injection moulded. The possible types of plastics include thermoplastic (which can be re-melted and re-moulded), thermoplastic elastomers (a hybrid plastic incorporating rubber) and thermoset plastic (which cannot be re-melted and re-moulded). The top housing portion 12 has an inner surface 40 and an outer surface 42. The top housing portion 12 is generally rectangular with two arms 44.

Projecting perpendicularly from inner surface 40 are: PCB supports 45, a side wall 46 having a remote surface 48, a side wall 50 having a remote surface 52, a forward wall 53 having a remote surface 54 and rear wall portions 56, 58, 60 having corresponding remote surfaces 64, 66 and 68, respectively. Remote surfaces 48, 52, 64 and 68 extend outwardly, perpendicular to their corresponding walls 46, 50, 56 and 60, respectively.

Each of remote surfaces 48, 52, 54, 64, 66, 68 preferably has alignment pins 72 projecting outwardly therefrom (ie: projecting away from and perpendicular to the plane of inner surface 40). Extending through side wall 46 and remote surface 48 are screw guide holes 74. Additional screw guide holes 74 extend through side wall 50 and remote surface 52.

Projecting from remote surfaces 48, 52, 64 and 68 are fingers 70 and 71 (preferably, one finger 71 projects from remote surface 48 and another finger 71 projects from remote surface 52). The fingers 70, 71 project from remote surfaces 46, 50, 64 and 68 towards the plane of inner surface 40. Further, the fingers 70, 71 extending from remote surface 48 of side wall 46 project away from side wall 50. The fingers 70, 71 extending from remote surface 52 of side wall 50 project away from side wall 46. The fingers 70 extending from remote surfaces 64 and 68 of rear wall portions 56 and 60 project away from forward wall 53.

Each finger 71 has a distant surface 73, which is the surface of each finger 71 most distant from remote surfaces 48, 52.

The fingers 70 project from remote surfaces 48, 52, 64 and 68 most of distance to the plane of inner surface 40. However, preferably, fingers 71 project less far, perhaps only half the distance from remote surface 48 or 52 to the plane of inside surface 40. The width of each finger 71 is preferably less than the width of each wall window 25.

The fingers 70 on each remote surface 48, 52, 64 and 68 are preferably evenly spaced from an adjacent finger 70 or finger 71, except for those fingers 70 adjacent a screw guide hole 74.

The method of enclosing the PCB 10 within top housing portion 12 and bottom housing 14 is suggested in FIG. 1. The PCB 10 is placed flat on the bottom housing portion 14 between side walls 22, 24, forward wall 26 and PCB enclosure walls 29 on the PCB supports 28, 30. The top housing portion 12 is then pushed towards the bottom housing portion 14 with the inside surface 40 of the top housing portion 12 facing the PCB 10. As the top housing portion 12 is pushed towards the bottom housing portion 14, the alignment pins 72 on remote surfaces 48, 52, 54, 64, 66, 68 pass through the alignment holes 16 of the PCB 10 and then extend into alignment indentations 34 of the bottom housing portion 14.

The fingers 70, 71 of the top housing portion 12 are long enough and project at an angle sufficient to contact side walls 22, 24 and PCB enclosure walls 29 of the bottom housing portion 14 when the top housing portion 12 and the bottom housing portion 14 are pushed towards each other. When the distant surface 73 of each finger 71 passes below the upper surface 27 of side windows 25, there is a "click" as the fingers 71 are biased within the windows 25. Once the fingers 71 are within the windows 25, the top housing portion 12 is engaged with bottom housing portion 14.

To further hold the top housing portion 12 against the bottom housing portion 14, screws (not shown) may be threaded through screw guide holes 74 of the top housing portion and the screw-receiving indentations 36 of the bottom housing portion 14 which are aligned with the screw guide holes 74. Of course, many other methods of engaging the top housing portion 12 with the bottom housing portion 14 are possible.

To disengage the top housing portion 12 from the bottom housing portion 14, any screws connecting portion 12 to portion 14 through screw guide holes 74 and screw-receiving indentations 36 are removed. Then, fingers 71 are manually pushed towards each other a distance sufficient so that as portions 12 and 14 are pulled apart, the distant surfaces 73 of the fingers 71 are not blocked by upper surfaces 27 of windows 25.

Of course, the materials used to manufacture the top housing portion 12 and the geometry of the fingers 70, 71 must be such that there is some flexibility and resiliency in the fingers 70, 71. The fingers 70, 71 must flex to allow the top housing portion 12 and the lower housing portion 14 to be pushed towards each other, while the fingers 70, 71 rub against side walls 22, 24 and PCB enclosure walls 29. The fingers 70, 71 must also be stiff enough to remain in contact with the side wall 22, 24 and the PCB enclosure wall 29. When the top housing portion 12 is pulled apart from the bottom housing portion 14, the fingers 70, 71 are sufficiently resilient to return to their original orientation with respect to the side walls 46, 50 and the rear wall portions 56, 60 of the top housing portion 12. Thus, in the preferred embodiment, the geometry and resilience of the fingers 70, 71 of the top housing portion 12 are configured to provide maximum contact pressure for the greatest possible surface area of the fingers 70, 71 against the bottom housing portion 14, to provide DC (direct current) and capacitive coupling, while also accommodating manufacturing tolerances and variations in the top housing portion 12 and the bottom housing portion 14. In this regard, to increase resilience, the fingers 70, 71 are preferably less thick than the distance between the inner surface 40 and the outer surface 42 of the top housing portion 12, although the thickness of the fingers 70, 71 is not necessarily uniform.

When the top housing portion 12 and the bottom housing portion 14 are pushed together, the contact of the fingers 70, 71 against walls 22, 24 and 29 creates EMI shielding around most of the PCB 10. The shielding provided by the fingers 70, 71 can be modified by modifying the width of the fingers 70, 71, the height of the fingers 70, 71 and the distance between adjacent fingers 70, 71. For example, the fingers 70, 71 can be designed to produce high contact force, at specified points against the walls 22, 24, 29 to produce low frequency shielding. High contact force can be produced if the width of the fingers 70, 71 is narrowed or if, for example, each finger has one nipple (not shown) where only the nipple (and not the rest of the fingers 70, 71) contacts an adjacent wall of the bottom housing portion 14. (In other words, if the pressure exerted by a finger remains the same, but the contact area is reduced, the force is increased.) Alternatively, the fingers 70, 71 can be designed to produce high frequency shielding, where, for example, a large surface area of each finger contacts an adjacent wall 22, 24, 29 of the bottom housing portion 14 to produce a capacitive effect.

Preferably, the fingers 70, 71 will surround at least a major portion of the perimeter of the PCB 10. As can be seen from FIG. 4b, portions of the perimeter of the top housing portion 12, such as the forward wall 53 and the rear wall portion 58, do not have fingers 70, 71. In those areas, shielding is produced by adjacent alignment pins 72 which extend from top housing portion 12 into alignment indentations 34 within the bottom housing portion 14. These areas also benefit from capacitive shielding (also known as capacitive coupling). For example, when the top housing portion 12 is connected to the bottom housing portion 14, the remote surface 54 (for example) of forward wall 53 is in close proximity to a portion of the perimeter of the PCB 10, thereby producing a capacitive effect for high frequency shielding.

There are many possible variations of the design and configuration of the fingers 70, 71 around the top housing portion 12. An alternate configuration is shown in the perspective views of FIGS. 5a and 5b. FIG. 5c is a magnified view of the circle area of FIG. 5b.

Figure 5A:
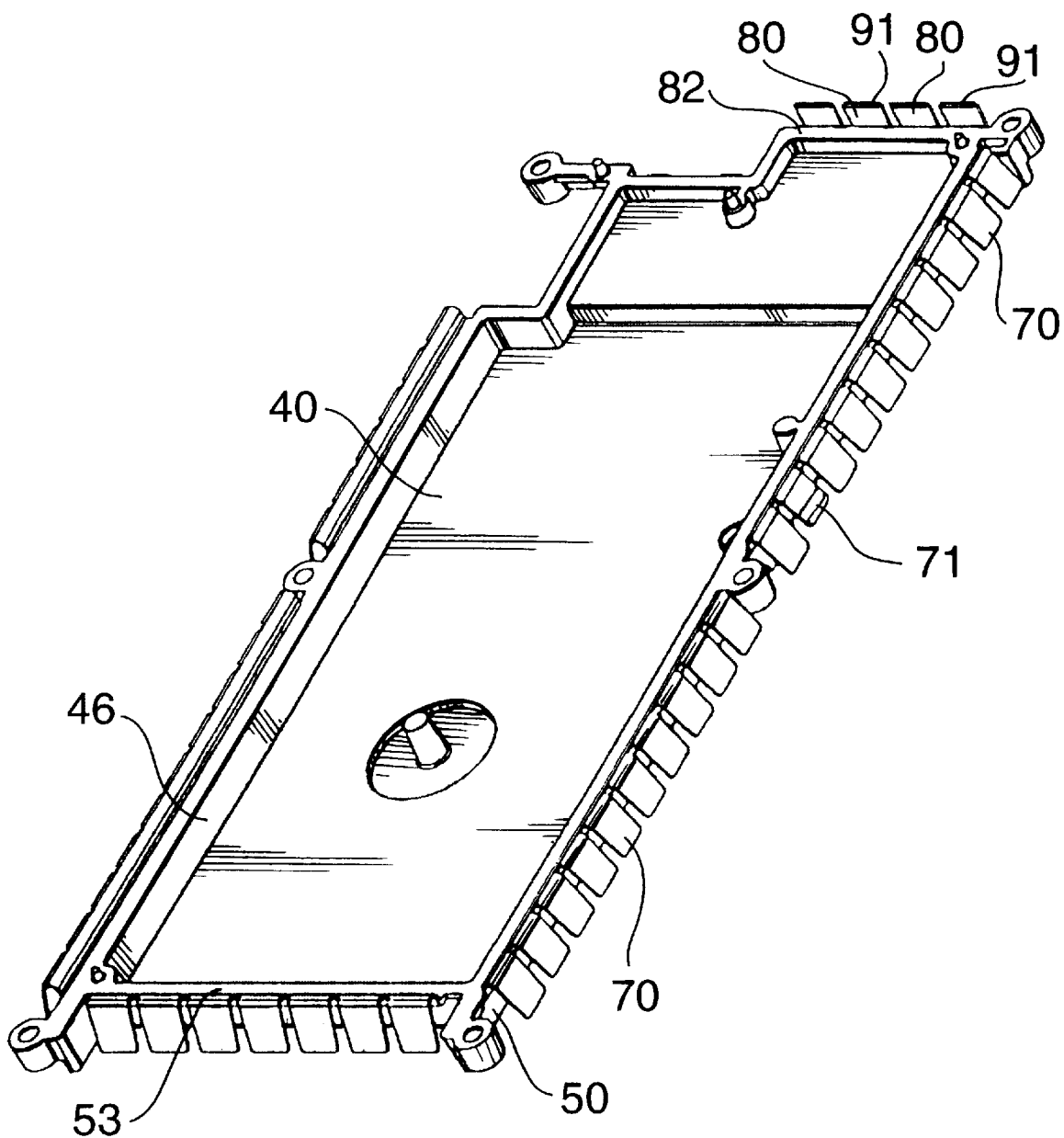
FIGS. 5a and 5b are perspective views of the inside surface and the outside surface, respectively, of a top housing portion in accordance with another embodiment of the present invention.
Figure 5B:
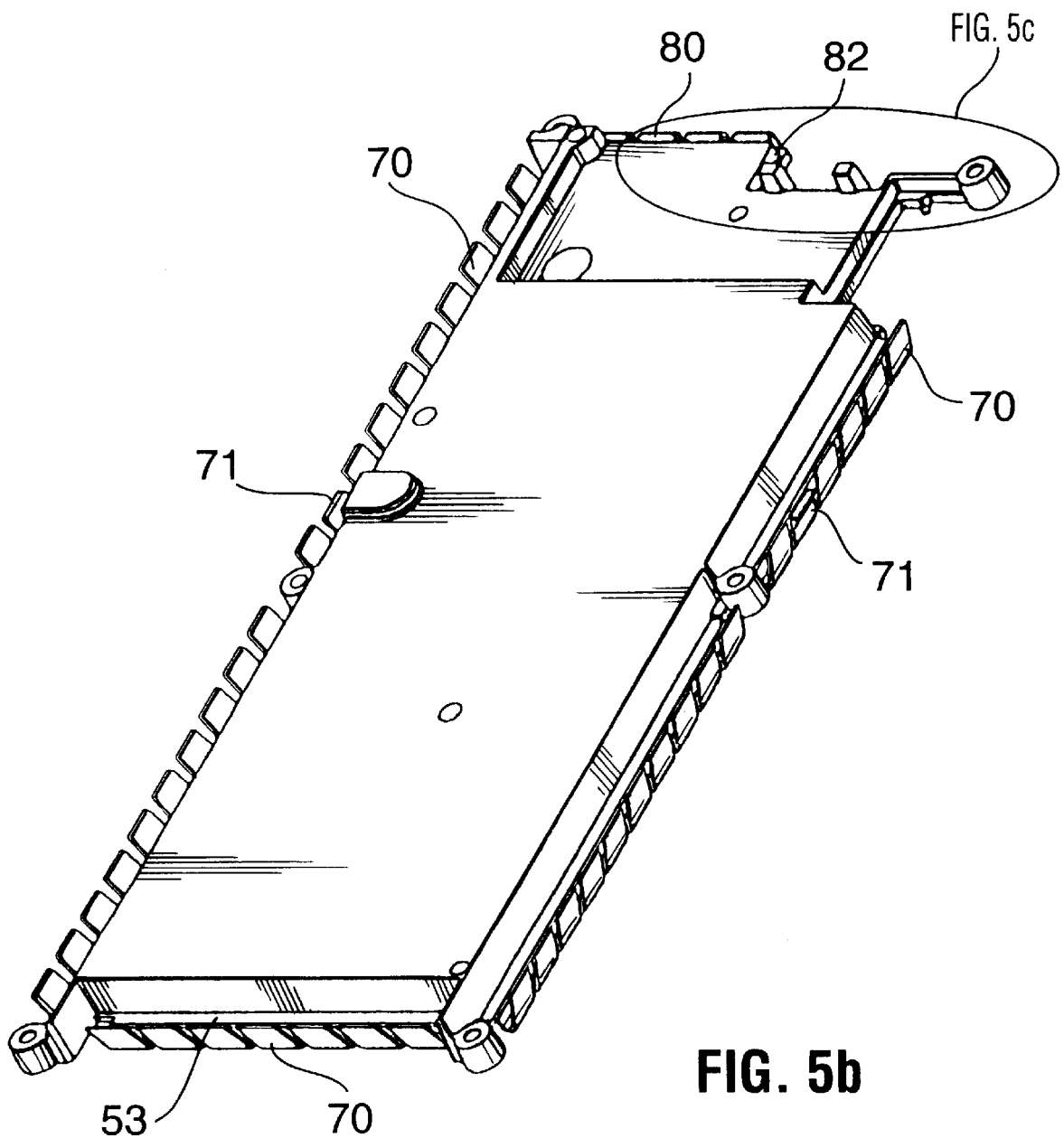
Figure 5C:
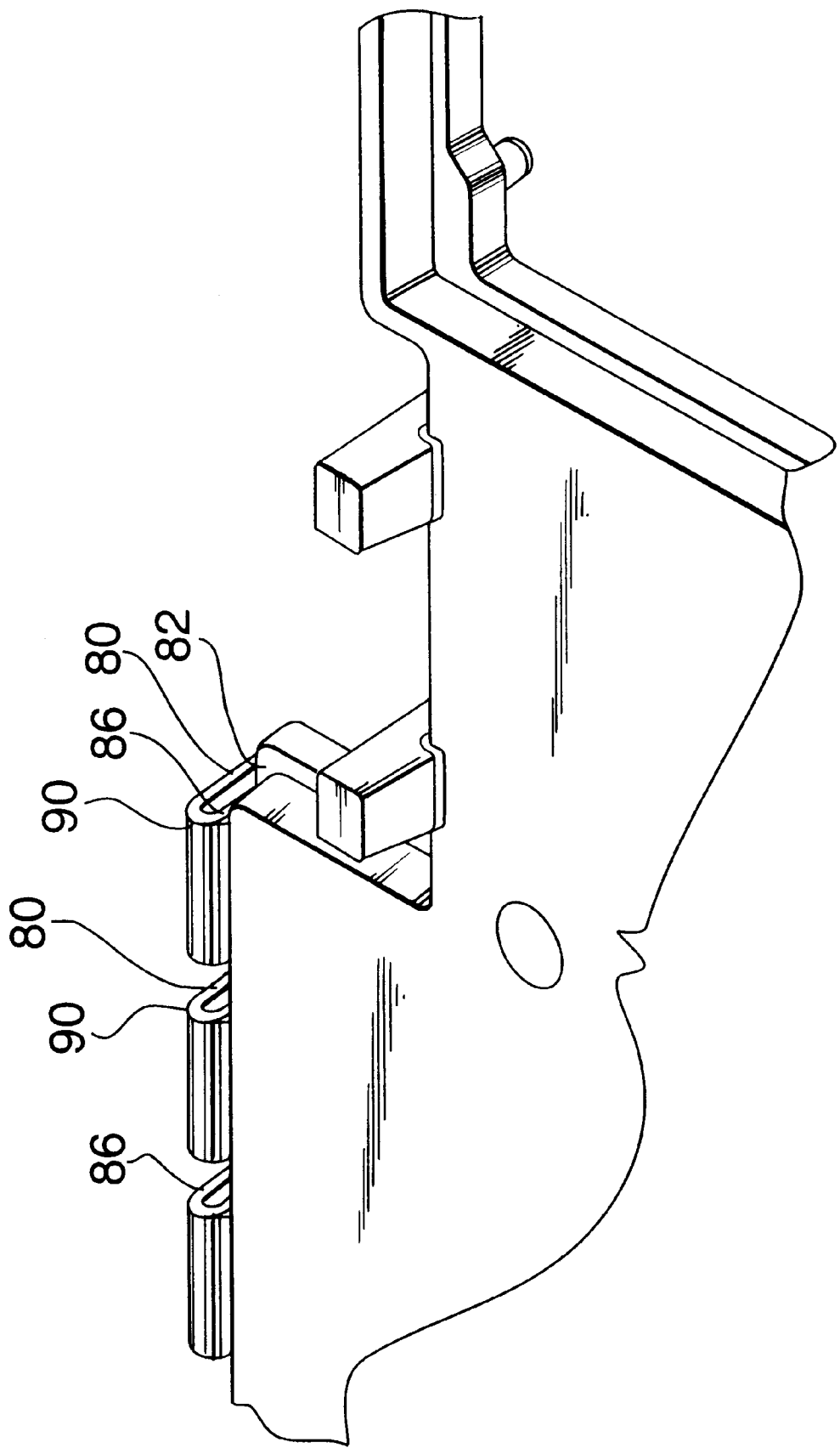
FIG. 5c is a magnified view of the circled area of FIG. 5b.

The fingers 70, 71 adjacent the side walls 46, 50 shown in FIGS. 5a and 5b are similar to those shown in FIGS. 4a and 4b. However, unlike the top housing portion 12 shown in FIGS. 4a and 4b, the top housing portion 12 of FIGS. 5a and 5b has additional fingers 70 adjacent forward wall 53.

As well, unlike the top housing portion 12 of FIGS. 4a and 4b, in FIGS. 5a and 5b, the top housing portion has fingers 80 adjacent the rear wall portion 82, which fingers 80 are oriented almost 180 degrees from fingers 70, 71. In other words, whereas fingers 70, 71 extend towards inside surface 40, fingers 80 extend away from inside surface 40. Further, fingers 80 are perpendicular to inside surface 40, unlike fingers 70, 71 (which are not perpendicular).

Rear wall portion 82 has a remote surface (not shown). As shown in the magnified view of FIG. 5c, extending from remote surface 84 towards the plane of inside surface 40, for each finger 80, is connecting portion 86. For each finger 80, portion 90 connects the finger 80 to the connecting portion 86. Each finger 80 has a distant surface 91 which is remote from portion 90 (see FIG. 5a). When the top housing portion 12 is connected to the bottom housing portion 14, unlike with fingers 70, 71, it is the distant surface 91 of fingers 80 which contacts the bottom housing surface 14.

Figure 6A:
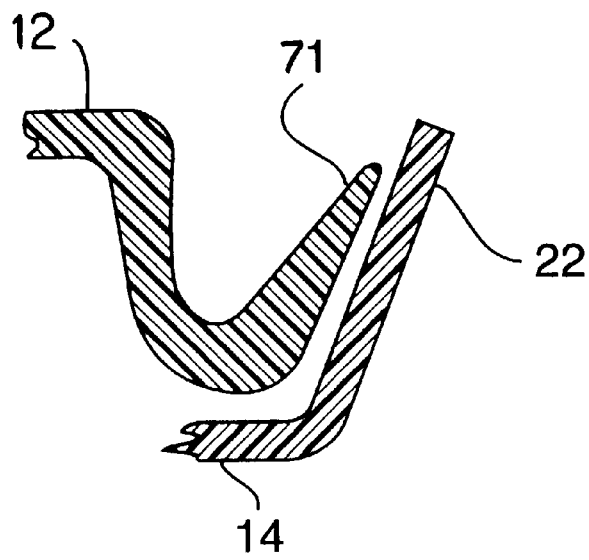
FIGS. 6a, 6b and 6c are enlarged cross-sectional views of three alternate configurations of a finger of a top housing portion adjacent a wall of a bottom housing portion.
Figure 6B:
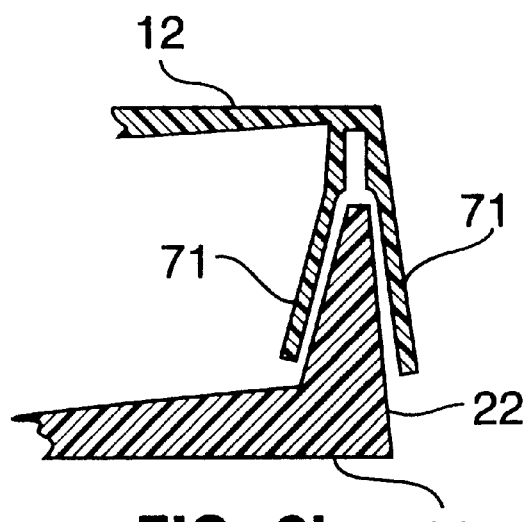
Figure 6C:
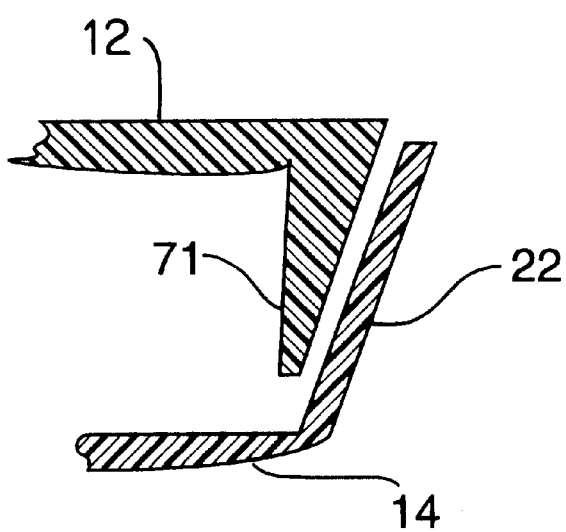

Numerous modifications and variations of the present invention are possible in light of the above teachings. It is therefore to be understood that within the scope of the appended claims, the invention may be practised otherwise than as specifically described herein. For example, as suggested above, the shape of the fingers 70 of the top housing portion 12 and the shape of the walls 22, 24, etc of the bottom housing portion 14 may differ substantially from the specific shapes described above. Some alternate configurations of a finger 70 of a top housing portion 12 adjacent a wall 22 of a bottom housing portion 14 are shown in FIGS. 6a, 6b and 6c, for example purposes.

As another example of a possible variation of the embodiments noted above, it is not necessary for either the top housing portion 12 or the bottom housing portion 14 to touch the PCB 10 for the invention to work. (However, in practice, given that the PCB 10 will be supported by the top housing portion 10 and the bottom housing portion 14, there will typically be contact.) Thus, for example, it is not necessary for the PCB 10 or the top housing portion 12 to have alignment pins.

It should also have been noted that the shape and structure of the top housing portion 12, as well as the materials used in its manufacture, could be used for the bottom housing portion 14, and vice versa. Further, either or both housing portions 12 and 14 could have fingers 70, 71.

What is claimed is:

1. An electronic assembly comprising electronic components and an electromagnetic interference and compatibility (EMI/EMC) shielding enclosure for the electronic components, the enclosure comprising a first housing portion, made of a conductive plastic material, having projecting, resilient fingers integral therewith and a conductive second housing portion, the electronic components being located between the first housing portion and the second housing portion, the fingers from the first housing portion surrounding at least a major portion of the electronic components and contacting the second housing portion, wherein the first housing portion further comprises an inner surface and walls substantially along the periphery of the inner surface projecting perpendicularly from the inner surface, each wall having a remote surface remote from the inner surface, the fingers projecting from the remote surface of the walls and wherein for each wall having fingers, the fingers project towards the plane of the inner surface and away from the wall.

2. The electronic assembly of claim 1 wherein the second housing portion comprises an inside surface having walls extending perpendicularly from the inside surface, the walls being located substantially along the perimeter of the inside surface.

3. The electronic assembly of claim 2 wherein the walls of the first housing portion are substantially within the perimeter of the walls of the second housing portion and the fingers contact at least some of the walls of the second housing portion.

4. The electronic assembly of claim 3 wherein the assembly further comprises a substrate, wherein the electronic components are carried on the substrate.

5. The electronic assembly of claim 4 wherein the substrate is a printed circuit board.

6. The electronic assembly of claim 5 wherein
   the remote surfaces of the walls of the first housing portion comprise alignment pins projecting away from the inner surface of the first housing portion;
   the printed circuit board is provided with alignment holes formed through the printed circuit board and located near the perimeter of the printed circuit board in a configuration adapted to align with the alignment pins; and
   the inside surface of the second housing portion further comprises indentations formed therein in a configuration adapted to align with the alignment pins.

7. The electronic assembly of claim 1 wherein each finger on a wall is substantially uniformly spaced from an adjacent finger.

8. The electronic assembly of claim 1 wherein the first housing portion further comprises an outer surface substantially parallel to the inner surface, and a base portion defined by the inner surface, the outer surface and the walls, wherein the thickness of the fingers is less than the thickness of the base portion.

9. An electronic assembly comprising electronic components and an electromagnetic interference and compatibility (EMI/EMC) shielding enclosure for the electronic components, the enclosure comprising a first housing portion, made of a conductive plastic material, having projecting, resilient fingers integral therewith and a conductive second housing portion, the electronic components being located between the first housing portion and the second housing portion, the fingers from the first housing portion surrounding at least a major portion of the electronic components and contacting the second housing portion, wherein the first housing portion further comprises an inner surface and walls substantially along the periphery of the inner surface projecting perpendicularly from the inner surface, each wall having a remote surface remote from the inner surface, the fingers projecting from the remote surface of the walls wherein
   at least one of the walls has fingers projecting towards the plane of the inner surface and away from the wall, and
   with respect to at least one of the walls, the fingers are connected to the remote surface by a connecting portion and a flat portion, the connecting portion being connected to the remote surface and projecting towards the inner surface, the flat portion extending from the connecting portion and extending away from the wall, the fingers extending from the flat portion away from the inner surface.

10. The electronic assembly of claim 9 wherein the second housing portion comprises an inside surface having walls extending perpendicularly from the inside surface, the walls being located substantially along the perimeter of the inside surface.

11. The electronic assembly of claim 10 wherein the walls of the first housing portion are substantially within the perimeter of the walls of the second housing portion and the fingers contact at least some of the walls of the second housing portion.

12. The electronic assembly of claim 11 wherein the assembly further comprises a substrate, wherein the electronic components are carried on the substrate.

13. The electronic assembly of claim 12 wherein the substrate is a printed circuit board.

14. The electronic assembly of claim 13 wherein the remote surfaces of the walls of the first housing portion comprise alignment pins projecting away from the inner surface of the first housing portion;

the printed circuit board is provided with alignment holes formed through the printed circuit board and located near the perimeter of the printed circuit board in a configuration adapted to align with the alignment pins; and the inside surface of the second housing portion further comprises indentations formed therein in a configuration adapted to align with the alignment pins.

15. The electronic assembly of claim 9 wherein each finger on a wall is substantially uniformly spaced from an adjacent finger.

16. The electronic assembly of claim 9 wherein the first housing portion further comprises an outer surface substantially parallel to the inner surface, and a base portion defined by the inner surface, the outer surface and the walls, wherein the thickness of the fingers is less than the thickness of the base portion.

17. An EMI/EMC shielding enclosure for electronic components, the enclosure comprising a first housing portion, made of a conductive plastic material, having projecting, resilient fingers integral therewith and a conductive second housing portion, wherein, when the enclosure is assembled with the electronic components located between the first housing portion and the second housing portion, the fingers from the first housing portion surround at least a major portion of the electronic components and contact the second housing portion, wherein the first housing portion further comprises an inner surface and walls substantially along the periphery of the inner surface projecting perpendicularly from the inner surface, each wall having a remote surface remote from the inner surface, the fingers projecting from the remote surface of the walls and wherein for each wall having fingers, the fingers project towards the plane of the inner surface and away from the wall.

18. The enclosure of claim 17 wherein each finger on a wall is substantially uniformly spaced from an adjacent finger.

19. The enclosure of claim 17 wherein the first housing portion further comprises an outer surface substantially parallel to the inner surface, and a base portion defined by the inner surface, the outer surface and the walls, wherein the thickness of the fingers is less than the thickness of the base portion.

20. The enclosure of claim 17 wherein the second housing portion comprises an inside surface having walls extending perpendicularly from the inside surface, the walls being located substantially along the perimeter of the inside surface.

21. The enclosure of claim 20 wherein the walls of the first housing portion are substantially within the perimeter of the walls of the second housing portion and the fingers contact at least some of the walls of the second housing portion.

22. The enclosure of claim 21 wherein the remote surfaces of the walls of the first housing portion comprise alignment pins projecting away from the inner surface of the first housing portion;

the electronic components are carried on a substrate, wherein the substrate is provided with alignment holes formed through the substrate and located near the perimeter of the substrate in a configuration adapted to align with the alignment pins; and the inside surface of the second housing portion further comprises indentations formed therein in a configuration adapted to align with the alignment pins.

23. An EMI/EMC shielding enclosure for electronic components, the enclosure comprising a first housing portion, made of a conductive plastic material, having projecting, resilient fingers integral therewith and a conductive second housing portion, wherein, when the enclosure is assembled with the electronic components located between the first housing portion and the second housing portion, the fingers from the first housing portion surround at least a major portion of the electronic components and contact the second housing portion, wherein the first housing portion further comprises an inner surface and walls substantially along the periphery of the inner surface projecting perpendicularly from the inner surface, each wall having a remote surface remote from the inner surface, the fingers projecting from the remote surface of the walls and wherein at least one of the walls has fingers projecting towards the plane of the inner surface and away from the wall, and with respect to at least one of the walls, the fingers are connected to the remote surface by a connecting portion and a flat portion, the connecting portion being connected to the remote portion and projecting towards the inner surface, the flat portion extending from the connecting portion and extending away from the wall, the fingers extending from the flat portion away from the inner surface.

24. The enclosure of claim 23 wherein each finger on a wall is substantially uniformly spaced from an adjacent finger.

25. The enclosure of claim 23 wherein the first housing portion further comprises an outer surface substantially parallel to the inner surface, and a base portion defined by the inner surface, the outer surface and the walls, wherein the thickness of the fingers is less than the thickness of the base portion.

26. The enclosure of claim 23 wherein the second housing portion comprises an inside surface having walls extending perpendicularly from the inside surface, the walls being located substantially along the perimeter of the inside surface.

27. The enclosure of claim 26 wherein the walls of the first housing portion are substantially within the perimeter of the walls of the second housing portion and the fingers contact at least some of the walls of the second housing portion.

28. The enclosure of claim 27 wherein the remote surfaces of the walls of the first housing portion comprise alignment pins projecting away from the inner surface of the first housing portion;

the electronic components are carried on a substrate, wherein the substrate is provided with alignment holes formed through the substrate and located near the perimeter of the substrate in a configuration adapted to align with the alignment pins; and the inside surface of the second housing portion further comprises indentations formed therein in a configuration adapted to align with the alignment pins.

* * * * *